US009275963B2

(12) United States Patent
Tsai et al.

(10) Patent No.: US 9,275,963 B2
(45) Date of Patent: Mar. 1, 2016

(54) SEMICONDUCTOR STRUCTURE HAVING STAGE DIFFERENCE SURFACE AND MANUFACTURING METHOD THEREOF (71) Applicant: XINTEC INC., Zhongli, Taoyuan County (TW)

(72) Inventors: Yung-Tai Tsai, New Taipei (TW); Shu-Ming Chang, New Taipei (TW); Chun-Wei Chang, New Taipei (TW); Chien-Hui Chen, Zhongli (TW); Tsang-Yu Liu, Zhubei (TW); Yen-Shih Ho, Kaohsiung (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 14/199,640

(22) Filed: Mar. 6, 2014

(65) Prior Publication Data
US 2014/0252659 A1    Sep. 11, 2014

Related U.S. Application Data (60) Provisional application No. 61/774,478, filed on Mar. 7, 2013.

(51) Int. Cl.
*H01L 23/00* (2006.01)
*H01L 23/31* (2006.01)
*H01L 21/78* (2006.01)

(52) U.S. Cl.
CPC ............... *H01L 24/05* (2013.01); *H01L 21/78* (2013.01); *H01L 23/3185* (2013.01);
(Continued)

(58) Field of Classification Search
CPC ............. H01L 23/49805; H01L 24/95; H01L 23/3121; H01L 21/6835; H01L 21/561; H01L 24/05; H01L 2924/00014; H01L 24/48; H01L 2221/68327; H01L 2221/6834; H01L 2221/68381; H01L 2224/0401; H01L 2224/04042; H01L 222/05558; H01L 2224/16227; H01L 2924/14; H01L 2924/1461; H01L 2224/16225; H01L 2924/120414
USPC ......... 257/774, 773, 775, 776, 690, 691, 786; 438/113
See application file for complete search history.

(56) References Cited

U.S. PATENT DOCUMENTS

| 5,119,116 | A  | * | 6/1992  | Yu ................................... 347/65 |
| 5,751,381 | A  | * | 5/1998  | Ono et al. ....................... 399/46 |
| 8,604,330 | B1 | * | 12/2013 | Hennessy et al. ............. 136/201 |
| 2001/0007375 | A1 | * | 7/2001  | Fjelstad et al. ................ 257/773 |
| 2008/0099907 | A1 | * | 5/2008  | Oganesian et al. ........... 257/693 |

(Continued)

FOREIGN PATENT DOCUMENTS

| TW | 200605267 | 2/2006 |
| TW | 201123369 | 7/2011 |
| TW | 201140779 | 11/2011 |

Primary Examiner — Alexander Oscar Williams
(74) Attorney, Agent, or Firm — Liu & Liu (57) ABSTRACT A semiconductor structure includes a wafer, at least one nonmetal oxide layer, a pad, a passivation layer, an isolation layer, and a conductive layer. The wafer has a first surface, a second surface, a third surface, a first stage difference surface connected between the second and third surfaces, and a second stage difference surface connected between the first and third surfaces. The nonmetal oxide layer is located on the first surface of the wafer. The pad is located on the nonmetal oxide layer and electrically connected to the wafer. The passivation layer is located on the nonmetal oxide layer. The isolation layer is located on the passivation layer, nonmetal oxide layer, the first, second and third surfaces of the wafer, and the first and second stage difference surfaces of the wafer. The conductive layer is located on the isolation layer and electrically contacts the pad.

14 Claims, 7 Drawing Sheets

(52) U.S. Cl.
CPC ........... *H01L 23/3192* (2013.01); *H01L 24/03* (2013.01); *H01L 2224/02371* (2013.01); *H01L 2224/04042* (2013.01); *H01L 2224/05124* (2013.01); *H01L 2224/05548* (2013.01); *H01L 2224/05568* (2013.01); *H01L 2224/05624* (2013.01); *H01L 2224/94* (2013.01); *H01L 2924/10156* (2013.01); *H01L 2924/1461* (2013.01)

(56) References Cited

U.S. PATENT DOCUMENTS

| | | | |
|---|---|---|---|
| 2010/0096637 A1* | 4/2010 | Yamazaki et al. | 257/66 |
| 2012/0161113 A1* | 6/2012 | Lowenthal et al. | 257/40 |
| 2013/0307125 A1* | 11/2013 | Huang et al. | 257/623 |
| 2014/0138675 A1* | 5/2014 | Yamazaki | 257/43 |
| 2014/0332968 A1* | 11/2014 | Ho et al. | 257/773 |

* cited by examiner

SEMICONDUCTOR STRUCTURE HAVING STAGE DIFFERENCE SURFACE AND MANUFACTURING METHOD THEREOF

RELATED APPLICATIONS

This application claims priority to U.S. provisional Application Ser. No. 61/774,478, filed Mar. 7, 2013, which is herein incorporated by reference.

BACKGROUND

1. Field of Invention

The present invention relates to a semiconductor structure and a semiconductor structure manufacturing method.

2. Description of Related Art

A conventional semiconductor structure may be composed of a wafer, a conductive pad, an oxide layer (e.g., $SiO_2$), and a redistribution layer. In general, when the semiconductor structure is manufactured, the conductive pad and the surface of the wafer are covered by the oxide layer. Thereafter, an opening is formed in the oxide layer above the conductive pad, and the redistribution layer covers the oxide layer. As a result, the redistribution layer may be electrically connected to the conductive pad through the opening of the oxide layer, and the redistribution layer on the conductive pad may be electrically connected to a printed circuit board by wire bonding.

However, when a cover needs to be arranged on the semiconductor structure, the cover is located above the conductive pad, so that the height of the bonding wire must be greater than the thickness of the cover to enable the wire to reach the printed circuit board out through the cover. As a result, it is difficult to reduce the overall thickness of the semiconductor structure during subsequent packaging process. Ultimately, product competitiveness is negatively affected.

SUMMARY

An aspect of the present invention is to provide a semiconductor structure.

According to an embodiment of the present invention, a semiconductor structure includes a chip, at least one nonmetal oxide layer, a conductive pad, a passivation layer, an isolation layer, and a conductive layer. The chip has a first surface, a second surface, a third surface, a first stage difference surface, and a second stage difference surface. The first, second, and third surfaces are parallel. The first stage difference surface is connected between the second and third surfaces, and the second stage difference surface is connected between the first and third surfaces. The nonmetal oxide layer is located on the first surface of the chip. The conductive pad is located on the nonmetal oxide layer and electrically connected to the chip. The passivation layer is located on the nonmetal oxide layer. The isolation layer is located on the passivation layer, the nonmetal oxide layer, the first, second and third surfaces of the chip, and the first and second stage difference surfaces of the chip. The conductive layer is located on the isolation layer and electrically contacts the conductive pad.

In an embodiment of the present invention, the second stage difference surface is perpendicular to the first and third surfaces.

In an embodiment of the present invention, an obtuse angle is formed between the first stage difference surface and the second surface.

In an embodiment of the present invention, an obtuse angle is formed between the first stage difference surface and the third surface.

In an embodiment of the present invention, the conductive layer is made of a material that includes aluminum.

In an embodiment of the present invention, the semiconductor structure further includes a printed circuit board. The printed circuit board is electrically connected to the conductive layer.

Another aspect of the present invention is to provide a semiconductor structure manufacturing method.

According to an embodiment of the present invention, a semiconductor structure manufacturing method includes a number of steps. (a) A wafer is provided, and at least one nonmetal oxide layer, a conductive pad, and a passivation layer are formed on a first surface of the wafer. (b) The passivation layer and the nonmetal oxide layer are etched to expose a first surface of the wafer. (c) The first surface of the wafer is etched, such that the wafer forms a second surface parallel to the first surface and a first stage difference surface connected to the first and second surfaces. (d) The first and second surfaces of the wafer and the first stage difference surface of the wafer are etched, such that a third surface parallel to the first surface and a second stage difference surface connected between the first and third surfaces are formed between the first surface and the first stage difference surface. (e) An isolation layer is covered on the passivation layer, the nonmetal oxide layer, the first, second and third surfaces of the wafer, and the first and second stage difference surfaces of the wafer. (f) An opening is formed on the passivation layer and the isolation layer aligned with the conductive pad, such that the conductive pad is exposed through the opening. (g) A conductive layer is formed on the isolation layer, and the conductive layer electrically contacts the conductive pad through the opening of the isolation layer. (h) The second surface of the wafer is cut, such that two sub-portions are formed from the wafer.

In an embodiment of the present invention, step (d) further includes etching a portion of the nonmetal oxide layer and a portion of the passivation layer protruding from the first surface of the wafer.

In an embodiment of the present invention, step (d) further includes using a photomask to cover the first surface of the wafer, the nonmetal oxide layer, and the passivation layer. The photomask is for retaining a portion of the wafer under the nonmetal oxide layer.

In an embodiment of the present invention, the semiconductor structure manufacturing method further includes electrically connecting the conductive layer and a printed circuit board.

In the aforementioned embodiments of the present invention, the isolation layer may cover the passivation layer, the nonmetal oxide layer, the first, second and third surfaces of the wafer, and the first and second stage difference surfaces of the wafer. Therefore, after the opening is formed in the passivation layer and the isolation layer is aligned with the conductive pad, the conductive layer may be formed on the isolation layer so as to electrically contact the conductive pad through the opening. As a result, the conductive layer may be arranged along the first surface, the second stage difference surface, the third surface, the first stage difference surface, and the second surface of the wafer. After the wafer is cut to form plural chips, the conductive layer on the second surface may be electrically connected to the printed circuit board by a wire, such that the printed circuit board can be electrically connected to the conductive pad.

Therefore, when a cover is located above the conductive pad, the signal transmission effect of the semiconductor structure is not affected. Moreover, the position of a conductive wire may be above the second surface of the chip, such that the thickness of the semiconductor structure is not increased due to the conductive wire, and it is necessary only to reduce the thickness of a wafer which is not cut yet to form plural chips. That is to say, the semiconductor structure may be flexibly applied in products, so as to ultimately improve product competitiveness.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

Figure 1:
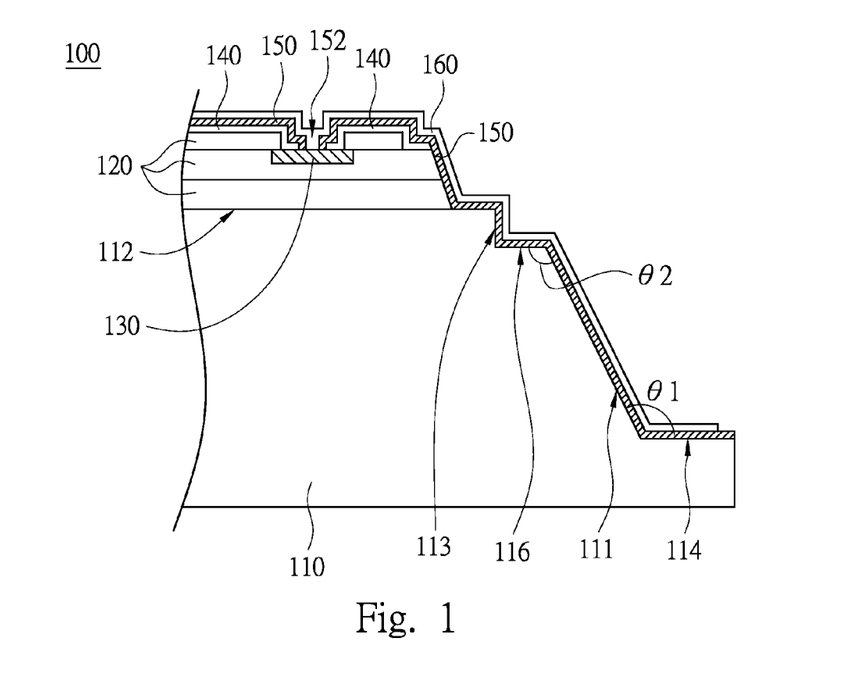
FIG. 1 is a cross-sectional view of a semiconductor structure according to an embodiment of the present invention.

FIG. 1 is a cross-sectional view of a semiconductor structure 100 according to an embodiment of the present invention. As shown in FIG. 1, the semiconductor structure 100 includes a chip 110, at least one nonmetal oxide layer 120, a conductive pad 130, a passivation layer 140, an isolation layer 150, and a conductive layer 160. The chip 110 has a first surface 112, a second surface 114, a third surface 116, a first stage difference surface 111, and a second stage difference surface 113. The first, second, and third surfaces 112, 114, 116 are parallel. The first stage difference surface 111 is connected between the second and third surfaces 114, 116, and the second stage difference surface 113 is connected between the first and third surfaces 112, 116. The nonmetal oxide layer 120 is located on the first surface 112 of the chip 110. The conductive pad 130 is located on the nonmetal oxide layer 120 and electrically connected to the chip 110. The passivation layer 140 is located on the nonmetal oxide layer 120. The isolation layer 150 is located on the passivation layer 140, the side surface of the nonmetal oxide layer 120, the first, second and third surfaces 112, 114, 116 of the chip 110, and the first and second stage difference surfaces 111, 113 of the chip 110. The conductive layer 160 is located on the isolation layer 150 and electrically contacts the conductive pad 130.

In this embodiment, the two ends of the second stage difference surface 113 are perpendicular to the first and third surfaces 112, 116 of the chip 110. An obtuse angle θ1 is formed between the first stage difference surface 111 and the second surface 114 of the chip 110, and an obtuse angle θ2 is formed between the first stage difference surface 111 and the third surface 116 of the chip 110. The nonmetal oxide layer 120 may be silicon oxide, but the present invention is not limited in this regard. Moreover, the conductive pad 130 and the conductive layer 160 may be made of a material that includes aluminum or other conductive metals. The chip 110 may be an image sensing element, a microelectromechanical system (MEMS) component, a calculating processor, etc., and the chip 110 may be made of a material that includes silicon. The chip 110 may be one of plural chips formed from a wafer after a dicing (cutting) process is performed with respect to the wafer.

Since the isolation layer 150 covers the passivation layer 140, the nonmetal oxide layer 120, the first, second and third surfaces 112, 114, 116 of the chip 110, and the first and second stage difference surfaces 111, 113 of the chip 110, after an opening 152 is formed in a portion of the passivation layer 140 and a portion of the isolation layer 150 aligned with the conductive pad 130 (i.e., the passivation layer 140 and the isolation layer 150 above the conductive pad 130), the conductive layer 160 may be formed on the isolation layer 150 so as to electrically contact the conductive pad 130 through the opening 152. As a result, the conductive layer 160 may be arranged along the first surface 112, the second stage difference surface 113, the third surface 116, the first stage difference surface 111, and the second surface 114 of the chip 110. When the conductive layer 160 on the second surface 114 of the chip 110 is electrically connected to a printed circuit board, the printed circuit board can be electrically connected to the conductive pad 130 on the chip 110. In the following description, the connection method of the conductive pad 130 and the printed circuit board will be described.

Figure 2:
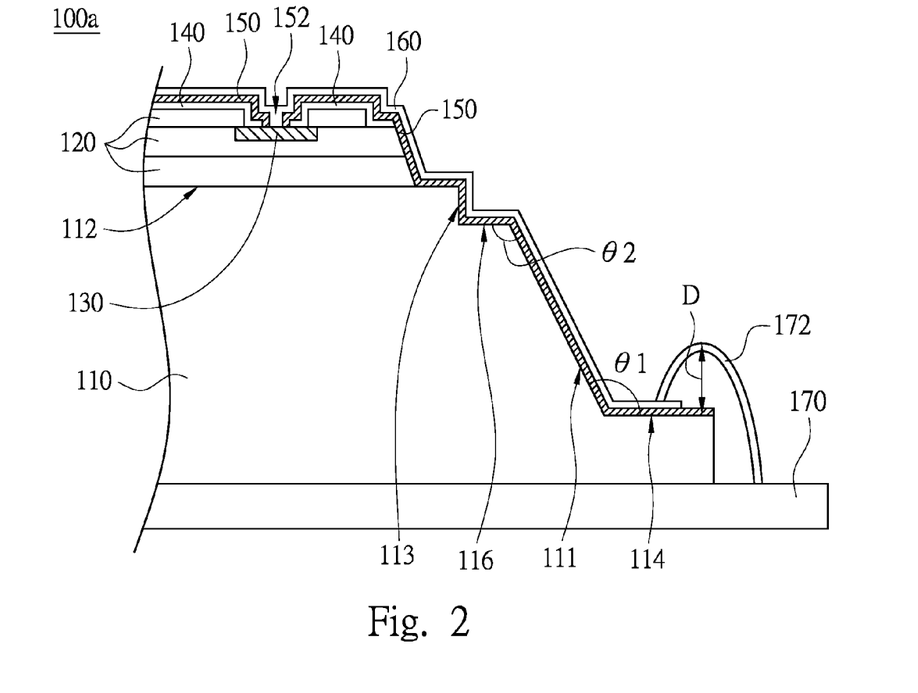
FIG. 2 is a cross-sectional view of a semiconductor structure according to an embodiment of the present invention.

FIG. 2 is a cross-sectional view of a semiconductor structure 100a according to an embodiment of the present invention. The difference between this embodiment and the embodiment shown in FIG. 1 is that the semiconductor structure 100a further includes a printed circuit board 170 and a conductive wire 172. In this embodiment, the conductive wire 172 is connected to a portion of the conductive layer 160 on the second surface 114 of the chip 110, and is also connected to the printed circuit board 170, such that the printed circuit board 170 can be electrically connected to the conductive layer 160 and the conductive pad 130. In this configuration, when a cover is located above the conductive pad 130, the signal transmission effect of the semiconductor structure 100a is not affected. Moreover, the position of the conductive wire 172 may be above the second surface 114 of the chip 110, such that the thickness of the semiconductor structure 100a is not increased due to the conductive wire 172. That is to say, a distance D between the highest point of the conductive wire 172 and the second surface 114 is significantly smaller than the overall thickness of the semiconductor structure 100a. When it is necessary to reduce the thickness of the semiconductor structure 100a, only the thickness of a wafer which is not cut yet to form plural chips 110 needs to be reduced. As a result, the semiconductor structures 100, 100a of FIGS. 1 and 2 may be flexibly applied in products, so as to ultimately improve product competitiveness.

It is to be noted that the structure and the connection relationships of the elements described above will not be repeated in the following description. Moreover, since the chip 110 is formed from a wafer after being diced, in the following description, a wafer 110 is shown and described in a state prior to cutting of the same into plural connected chips 110.

Figure 3:
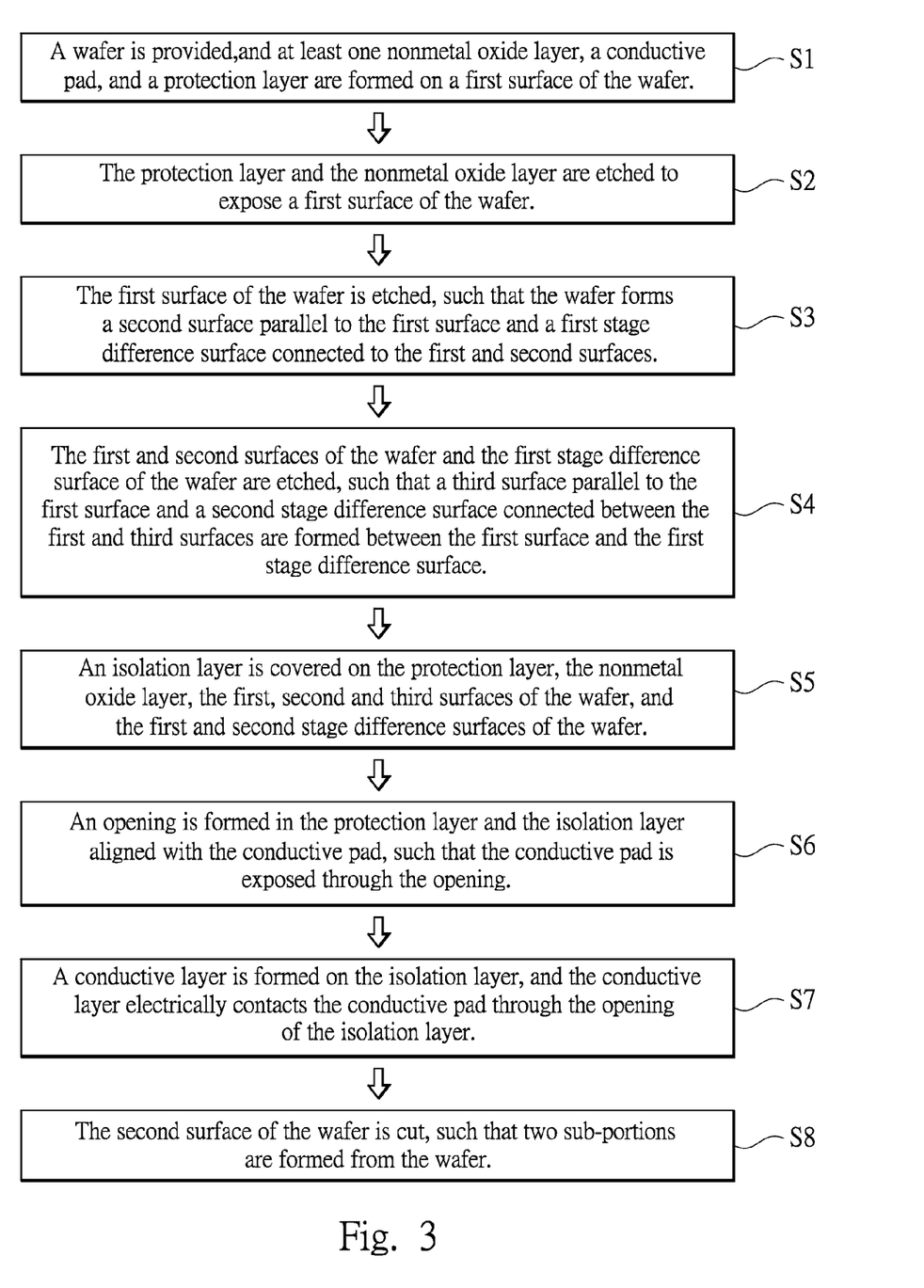
FIG. 3 is a flow chart of a semiconductor structure manufacturing method according to an embodiment of the present invention.

FIG. 3 is a flow chart of a semiconductor structure manufacturing method according to an embodiment of the present invention. In step S1, a wafer is provided, and at least one nonmetal oxide layer, a conductive pad, and a passivation layer are formed on a first surface of the wafer. Thereafter in step S2, the passivation layer and the nonmetal oxide layer are etched to expose a first surface of the wafer. Next in step S3, the first surface of the wafer is etched, such that the wafer forms a second surface parallel to the first surface and a first stage difference surface connected to the first and second surfaces. Thereafter in step S4, the first and second surfaces of the wafer and the first stage difference surface of the wafer are etched, such that a third surface parallel to the first surface and a second stage difference surface connected between the first and third surfaces are formed between the first surface and the first stage difference surface. Next in step S5, an isolation layer is covered on the passivation layer, the nonmetal oxide layer, the first, second and third surfaces of the wafer, and the first and second stage difference surfaces of the wafer. Thereafter in step S6, an opening is formed in the passivation layer and the isolation layer aligned with the conductive pad, such that the conductive pad is exposed through the opening. Next in step S7, a conductive layer is formed on the isolation layer, and the conductive layer electrically contacts the conductive pad through the opening of the isolation layer. Finally in step S8, the second surface of the wafer is cut, such that two sub-portions are formed from the wafer. In the following description, each of the aforesaid steps of the semiconductor structure manufacturing method will be described.

Figure 4:
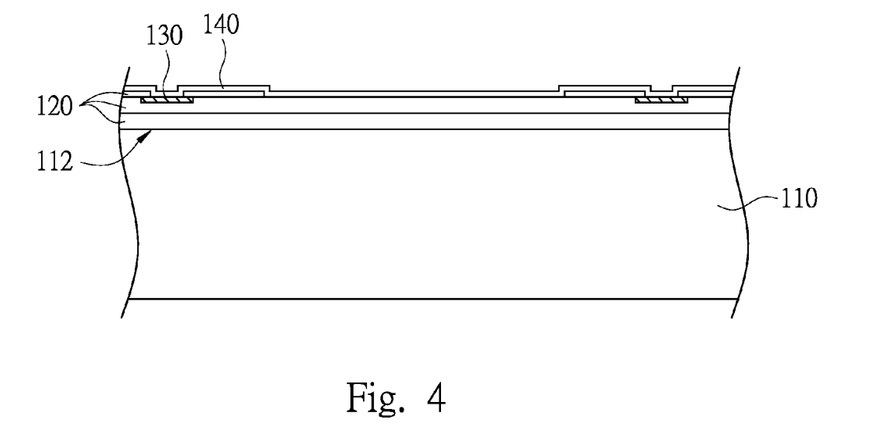
FIG. 4 is a schematic view of a nonmetal oxide layer, a conductive pad, and a passivation layer shown in FIG. 3 after being formed on a first surface of a wafer.

FIG. 4 is a schematic view of the nonmetal oxide layer 120, the conductive pad 130, and the passivation layer 140 shown in FIG. 3 after being formed on the first surface 112 of the wafer 110. In this embodiment, the number of the nonmetal oxide layers 120 is three, but the present invention is not limited in this regard, and the number of the nonmetal oxide layers 120 may be varied as deemed necessary by designers. After the nonmetal oxide layer 120 is formed on the first surface 112 of the wafer 110, the conductive pad 130 may be formed on the nonmetal oxide layer 120. Thereafter, the passivation layer 140 can cover the conductive pad 130 and the nonmetal oxide layer 120.

Figure 5:
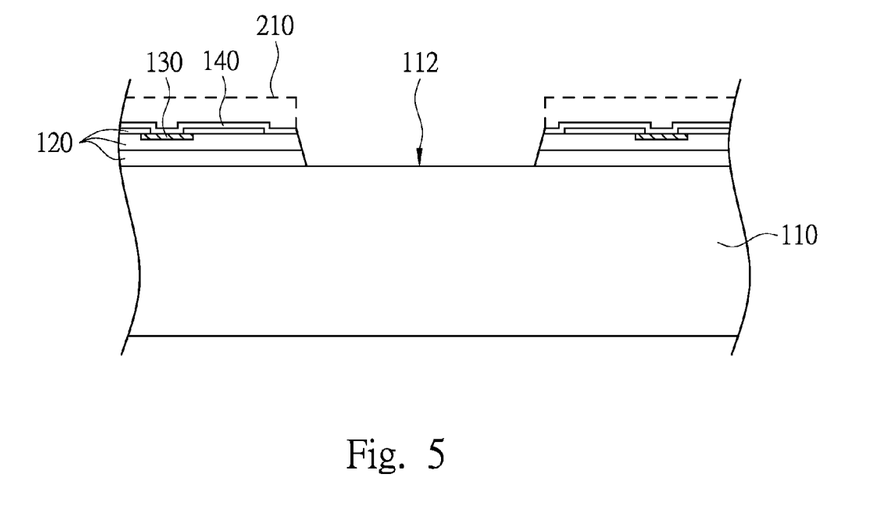
FIG. 5 is a schematic view of the passivation layer and the nonmetal oxide layer shown in FIG. 4 after being etched.

FIG. 5 is a schematic view of the passivation layer 140 and the nonmetal oxide layer 120 shown in FIG. 4 after being etched. As shown in FIG. 4 and FIG. 5, after the passivation layer 140 is formed, a photomask 210 may be used on the passivation layer 140. An etching process is performed on a portion of the passivation layer 140 and a portion of the nonmetal oxide layer 120 between two of the conductive pads 130, such that the first surface 112 of the wafer 110 is exposed.

Figure 6:
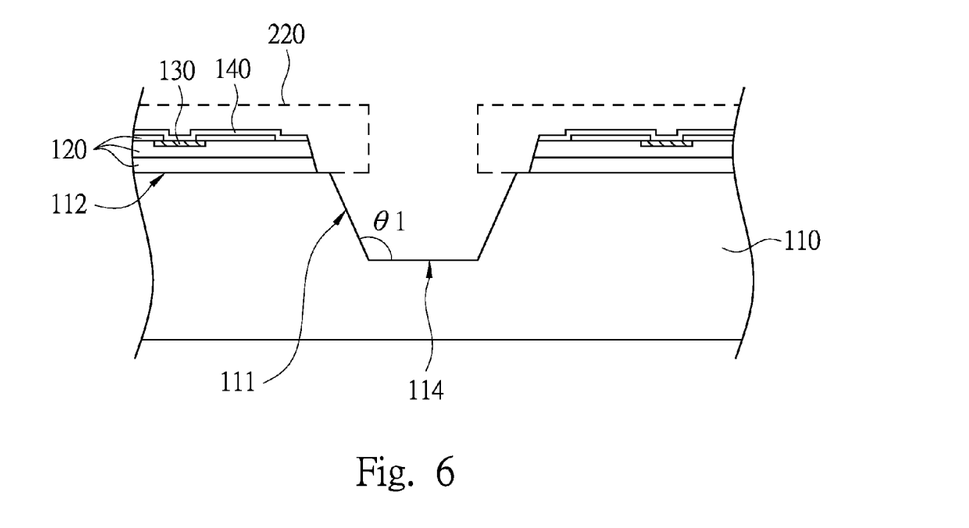
FIG. 6 is a schematic view of the first surface of the wafer shown in FIG. 5 after being etched.

FIG. 6 is a schematic view of the first surface 112 of the wafer 110 shown in FIG. 5 after being etched. As show in FIG. 5 and FIG. 6, after the first surface 112 of the wafer 110 is exposed, a photomask 220 may be used on the first surface 112 of the wafer 110. An etching process is performed on the first surface 112 of the wafer 110, such that the wafer 110 forms the second surface 114 parallel to the first surface 112 and the first stage difference surface 111 connected to the first and second surfaces 112, 114. The first stage difference surface 111 and the second surface 114 form a trench, and the obtuse angle θ1 is formed between the first stage difference surface 111 and the second surface 114. The purpose in this etching stage is to form the trench in the wafer 110, and so the first stage difference surface 111 and the second surface 114 are rough.

Figure 7:
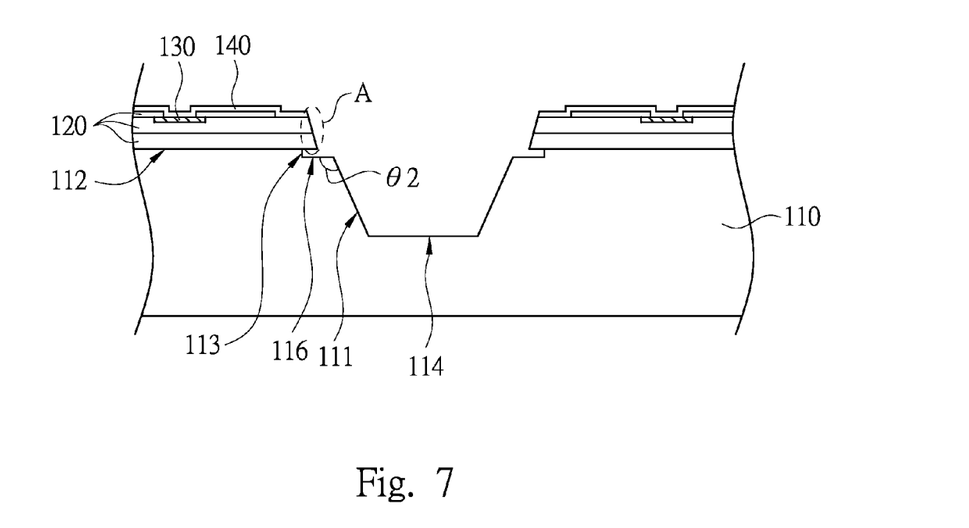
FIG. 7 is a schematic view of the first surface, a second surface, and a first stage difference surface of the wafer shown in FIG. 6 after being etched.

FIG. 7 is a schematic view of the first and second surfaces 112, 114, and the first stage difference surface 111 of the wafer 110 shown in FIG. 6 after being etched. As shown in FIG. 6 and FIG. 7, after the second surface 114 and the first stage difference surface 111 are formed, another etching process may be performed on the first and second surfaces 112, 114, and the first stage difference surface 111 of the wafer 110, such that the third surface 116 parallel to the first surface 112 and the second stage difference surface 113 connected between the first and third surfaces 111, 116 are formed between the first surface 112 and the first stage difference surface 111. The obtuse angle θ2 is formed between the first stage difference surface 111 and the third surface 116. The purpose in this etching stage is to smooth the first stage difference surface 111 and the second surface 114, such that subsequent process materials may be attached on the first stage difference surface 111 and the second surface 114. Therefore, the probability of encountering a broken wire situation may be reduced.

In the step of FIG. 7, since no photomask is used in the etching process, a portion of the nonmetal oxide layer 120 and a portion of the passivation layer 140 protrude from the first surface 112 of the wafer 110, such as in the case of a protrusion structure in an area A of the nonmetal oxide layer 120 and the passivation layer 140. The protrusion structure may cause subsequent process materials used to cover the structure in the area A to be broken.

Figure 8:
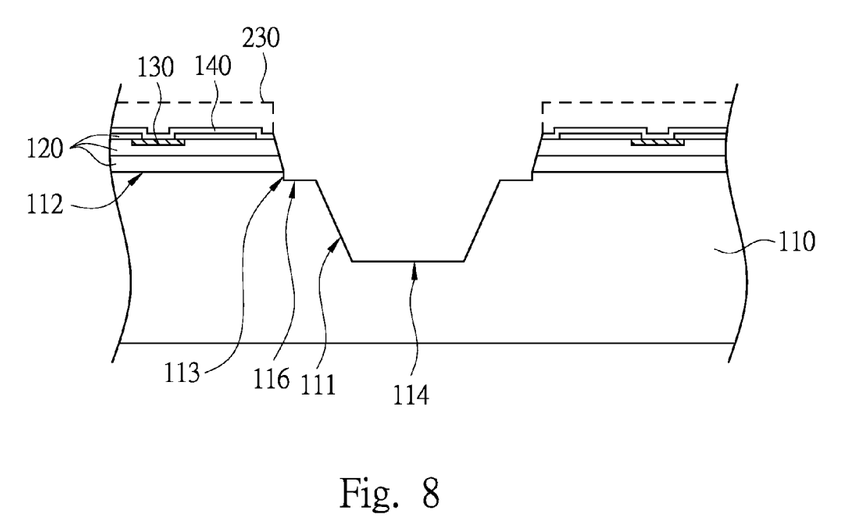
FIG. 8 is a schematic view of a portion of the nonmetal oxide layer and a portion of the passivation layer protruding from the first surface of the wafer shown in FIG. 7 after being etched.

FIG. 8 is a schematic view of a portion of the nonmetal oxide layer 120 and a portion of the passivation layer 140 protruding from the first surface 112 of the wafer 110 shown in FIG. 7 after being etched. As shown in the FIG. 7 and FIG. 8, in order to prevent the protrusion structure from causing subsequent process materials to be broken, a photomask 230 may be used on the passivation layer 140, and an etching process is performed on a portion of the nonmetal oxide layer 120 and a portion of the passivation layer 140 protruding from the first surface 112 of the wafer 110.

In the steps of FIGS. 7 and 8, since no photomask for protecting the wafer 110 under the area A is used in the etching process, the protrusion structure must be eliminated using an additional etching process. However, in another embodiment, a photomask may be used to prevent the nonmetal oxide layer 120 and the passivation layer 140 from forming the protrusion structure.

Figure 9:
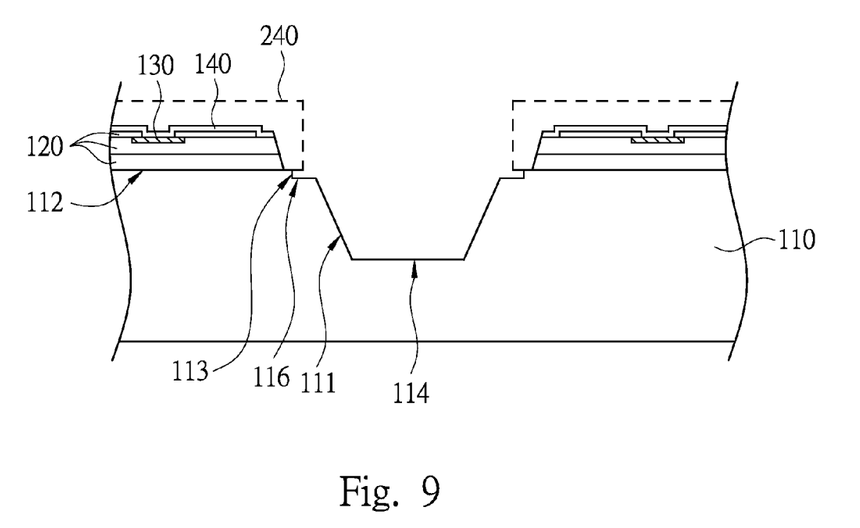
FIG. 9 is a schematic view of the first and second surfaces, and the first stage difference surface of the wafer shown in FIG. 6 after being etched.

FIG. 9 is a schematic view of the first and second surfaces 112, 114, and the first stage difference surface 111 of the wafer 110 shown in FIG. 6 after being etched. The difference between this embodiment and the embodiment shown in FIG. 7 is that a photomask 240 is used to cover the first surface 112 of the wafer 110, the nonmetal oxide layer 120, and the passivation layer 140. The photomask 240 is used to retain a portion of the wafer 110 under the nonmetal oxide layer 120, such that the wafer 110 under the nonmetal oxide layer 120 is not removed in the etching process. As a result, the aforesaid protrusion structure is not formed, such that the structures of FIGS. 8 and 9 are substantially the same.

In the following processes, the structure shown in FIG. 8 is used as an example in the description. However, it is to be noted that since the structures of FIGS. 8 and 9 are substantially the same, the structure shown in FIG. 9 also could have been used.

Figure 10:
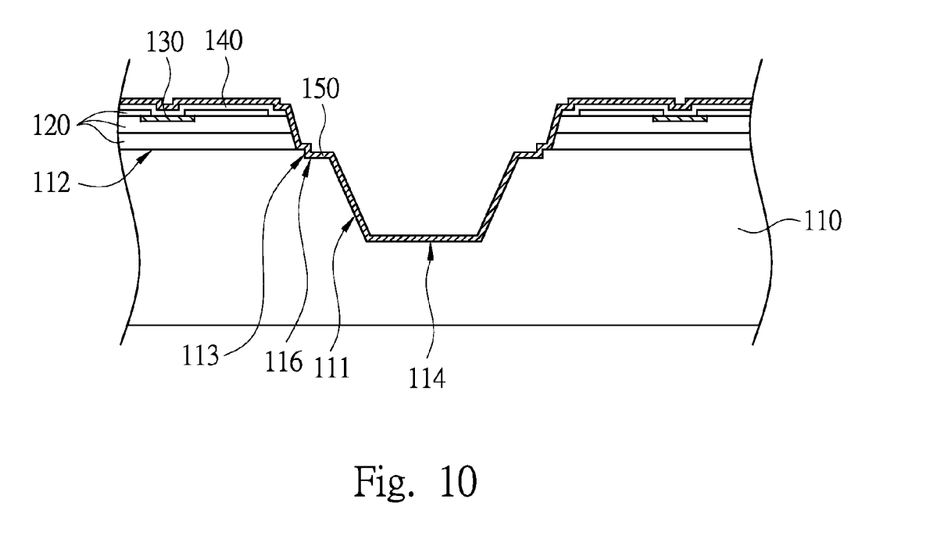
FIG. 10 is a schematic view of the passivation layer, the nonmetal oxide layer, the first, second, and third surfaces of the wafer, the first stage difference surface of the wafer, and a second stage difference surface of the wafer shown in FIG. 8 after being covered by an isolation layer.

FIG. 10 is a schematic view of the passivation layer 140, the nonmetal oxide layer 120, the first, second, and third surfaces 112, 114, 116 of the wafer 110, and the first and second stage difference surface 111, 113 of the wafer 110 shown in FIG. 8 after being covered by the isolation layer 150. As shown in FIG. 8 and FIG. 10, after the structure of FIG. 8 is formed, a process for photoresist cleaning may be applied to the structure. Thereafter, the isolation layer 150 may cover the passivation layer 140, the nonmetal oxide layer 120, the first, second, and third surfaces 112, 114, 116 of the wafer 110, and the first and second stage difference surface 111, 113 of the wafer 110.

Figure 11:
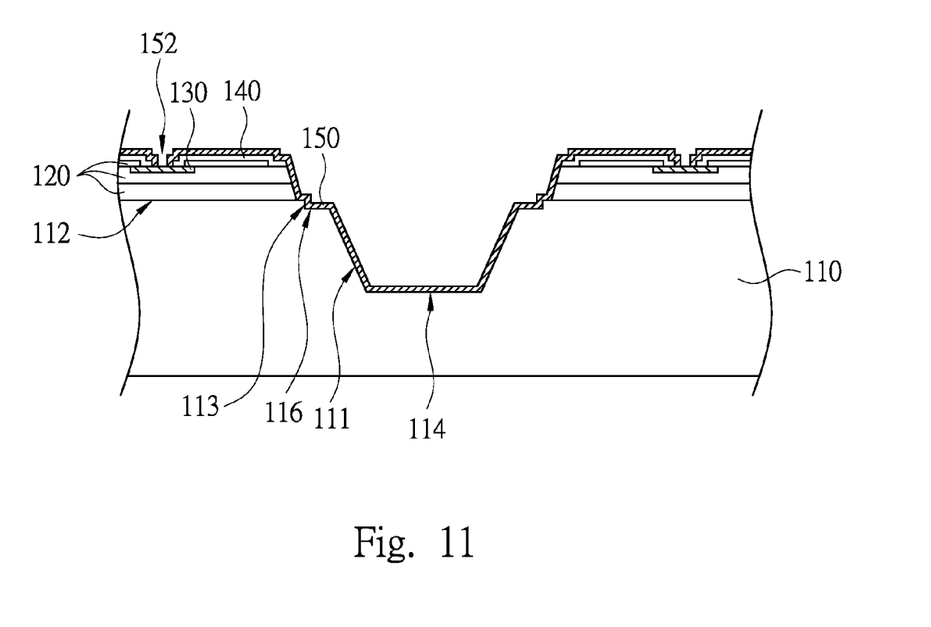
FIG. 11 is a schematic view of the passivation layer and the isolation layer aligned with the conductive pad shown in FIG. 10 after formation of an opening.

FIG. 11 is a schematic view of the passivation layer 140 and the isolation layer 150 aligned with the conductive pad 130 shown in FIG. 10 after formation of the opening 152. As shown in FIG. 10 and FIG. 11, after the isolation layer 150 is formed, an etching process may be performed on the passivation layer 140 and the isolation layer 150 aligned with the conductive pad 130 to form the opening 152, such that the conductive pad 130 is exposed through the opening 152.

Figure 12:
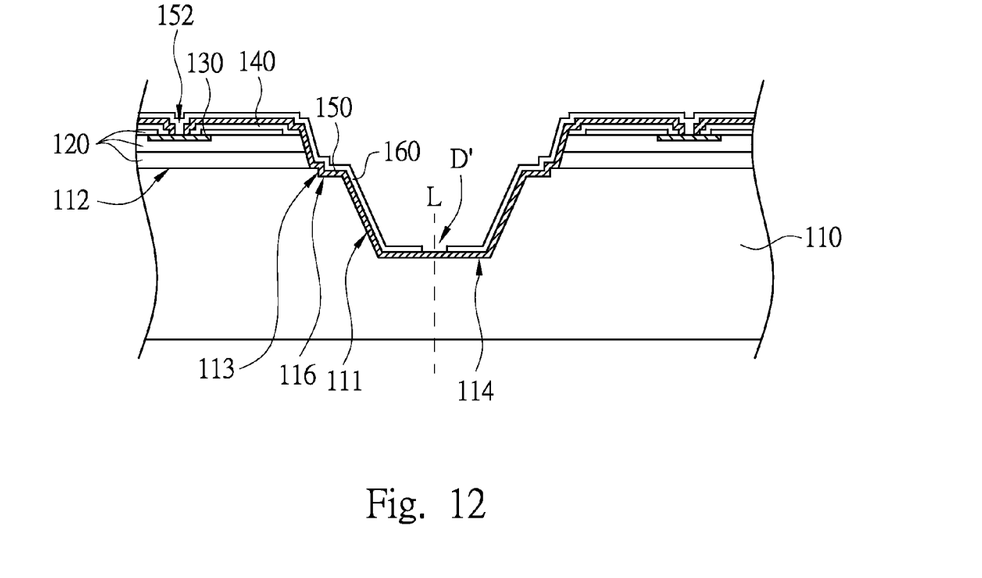
FIG. 12 is a schematic view of a conductive layer after being formed on the isolation layer shown in FIG. 11.

FIG. 12 is a schematic view of the conductive layer 160 after being formed on the isolation layer 150 shown in FIG. 11. As shown in FIG. 11 and FIG. 12, after the opening 152 is formed, the conductive layer 160 may be formed on the isolation layer 150, such that the conductive layer 160 can electrically contact the conductive pad 130 through the opening 152 of the isolation layer 150. In this embodiment, the conductive layer 160 on the second surface 114 of the wafer 110 has a distance D'. A cutter may cut (dice) the second surface 114 of the wafer 110 by the distance D' along a line L, such that two divided sub-portions (i.e., two chips) are formed from the wafer 110. As a result, the semiconductor structure 100 shown in FIG. 1 can be obtained.

Thereafter, the conductive layer 160 may be electrically connected to a printed circuit board by wire bonding, and the semiconductor structure 100a shown in FIG. 2 can be obtained.

Figure 13:
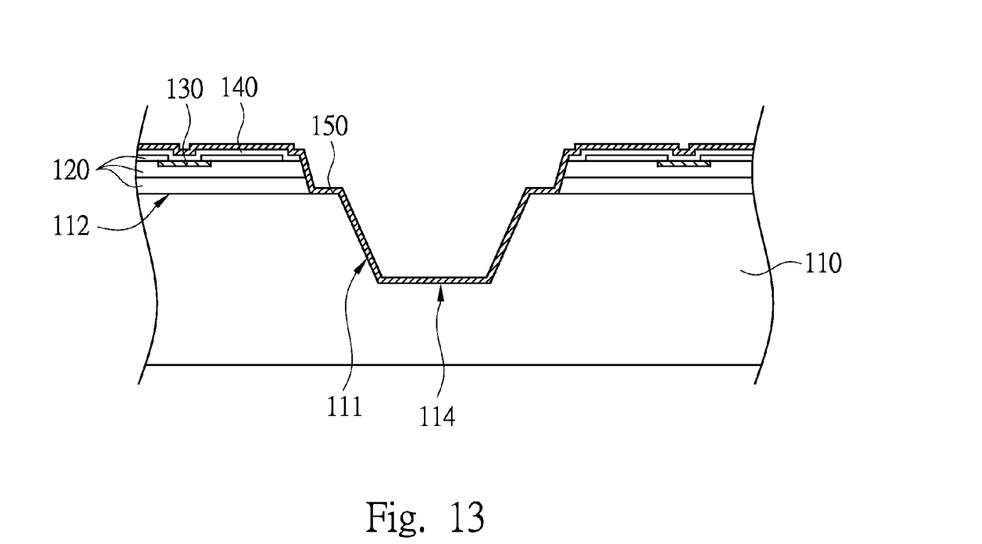
FIG. 13 is a schematic view of the passivation layer, the nonmetal oxide layer, the first and second surfaces of the wafer, and the first stage difference surface of the wafer shown in FIG. 6 after being covered by the isolation layer.

FIG. 13 is a schematic view of the passivation layer 140, the nonmetal oxide layer 120, the first and second surfaces 112, 114 of the wafer, and the first stage difference surface 111 of the wafer 110 shown in FIG. 6 after being covered by the isolation layer 150. As shown in FIG. 6 and FIG. 13, in the step of FIG. 6, if an optimal etching process is used to etch the first surface 112 of the wafer 110, the stair structure composed of the second stage difference surface 113 and the third surface 116 shown in FIGS. 7 to 12 is not formed, so that the first surface 112 and the first stage difference surface 111 may be connected in subsequent processes. That is to say, the isolation layer 150 may be directly formed on the structure of FIG. 6 by utilizing the optimal etching process, and the structure of FIG. 13 may be obtained. As a result, the processes of the photomask 230 shown in FIG. 8 and the photomask 240 shown in FIG. 9 can be omitted, and the probability of encountering a broken wire situation with respect to the conductive layer 160 (see FIG. 12) caused by turning may be reduced in the subsequent process.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A semiconductor structure comprising:
a chip having a first surface, a second surface, a third surface, a first stage difference surface, and a second stage difference surface, wherein the first, second, and third surfaces are parallel, the first stage difference surface is connected between the second and third surfaces, and the second stage difference surface is connected between the first and third surfaces, and wherein the second stage difference surface, the third surface, the first stage difference surface, and the second surface are connected in sequence and formed at one side of the chip;
at least one nonmetal oxide layer located on the first surface of the chip;
a conductive pad located on the nonmetal oxide layer and electrically connected to the chip;
a passivation layer located on the nonmetal oxide layer;
an isolation layer located on the passivation layer, the nonmetal oxide layer, the first, second and third surfaces of the chip, and the first and second stage difference surfaces of the chip; and
a conductive layer located on the isolation layer and electrically contacting the conductive pad.

2. The semiconductor structure of claim 1, wherein the second stage difference surface is perpendicular to the first and third surfaces.

3. The semiconductor structure of claim 1, wherein an obtuse angle is formed between the first stage difference surface and the second surface.

4. The semiconductor structure of claim 1, wherein an obtuse angle is formed between the first stage difference surface and the third surface.

5. The semiconductor structure of claim 1, wherein the conductive layer is made of a material that includes aluminum.

6. The semiconductor structure of claim 1, further comprising:
a printed circuit board electrically connected to the conductive layer.

7. A semiconductor structure manufacturing method comprising:
(a) providing a wafer, wherein at least one nonmetal oxide layer, a conductive pad, and a passivation layer are formed on a first surface of the wafer;
(b) etching the passivation layer and the nonmetal oxide layer to expose a first surface of the wafer;

(c) etching the first surface of the wafer, such that the wafer forms a second surface parallel to the first surface and a first stage difference surface connected to the first and second surfaces;

(d) etching the first and second surfaces of the wafer and the first stage difference surface of the wafer, such that a third surface parallel to the first surface and a second stage difference surface connected between the first and third surfaces are formed between the first surface and the first stage difference surface, wherein the second stage difference surface, the third surface, the first stage difference surface, and the second surface are connected in sequence;

(e) covering an isolation layer on the passivation layer, the nonmetal oxide layer, the first, second and third surfaces of the wafer, and the first and second stage difference surfaces of the wafer;

(f) forming an opening in the passivation layer and the isolation layer aligned with the conductive pad, such that the conductive pad is exposed through the opening;

(g) forming a conductive layer on the isolation layer, wherein the conductive layer electrically contacts the conductive pad through the opening of the isolation layer; and (h) cutting the second surface of the wafer, such that two sub-portions are formed from the wafer, and the second stage difference surface, the third surface, the first stage difference surface, and the second surface are at one side of one of the sub-portions.

8. The semiconductor structure manufacturing method of claim 7, wherein step (d) further comprises:

etching a portion of the nonmetal oxide layer and a portion of the passivation layer protruding from the first surface of the wafer.

9. The semiconductor structure manufacturing method of claim 7, wherein step (d) further comprises:

using a photomask to cover the first surface of the wafer, the nonmetal oxide layer, and the passivation layer, wherein the photomask is for retaining a portion of the wafer under the nonmetal oxide layer.

10. The semiconductor structure manufacturing method of claim 7, further comprising:

electrically connecting the conductive layer and a printed circuit board.

11. The semiconductor structure manufacturing method of claim 7, wherein the second stage difference surface is perpendicular to the first and third surfaces.

12. The semiconductor structure manufacturing method of claim 7, wherein an obtuse angle is formed between the first stage difference surface and the second surface.

13. The semiconductor structure manufacturing method of claim 7, wherein an obtuse angle is formed between the first stage difference surface and the third surface.

14. The semiconductor structure of claim 1, wherein one edge of the second stage difference surface is connected to one edge of the third surface, another edge of the third surface is connected to one edge of the first stage difference surface, and another edge of the first stage difference surface is connected to one edge of the second surface, to thereby connect in sequence.

* * * * *